United States Patent [19]

Busacca et al.

[11] 4,313,091
[45] Jan. 26, 1982

[54] CRANKSHAFT TUNING MECHANISMS FOR MICROWAVE OSCILLATORS

[75] Inventors: Guido Busacca; Vincenzo Meli; Arcangelo Passaglia; Michele Sanfilippo, all of Palermo, Italy

[73] Assignee: Societa Italiana Telecomunicazioni Siemens S.p.A., Milan, Italy

[21] Appl. No.: 120,547

[22] Filed: Feb. 11, 1980

[30] Foreign Application Priority Data

Feb. 13, 1979 [IT] Italy .............................. 20141 A/79

[51] Int. Cl.³ .................... H01P 7/04; H03B 9/10; H03B 23/00
[52] U.S. Cl. .................... 331/90; 315/39.61; 331/178; 333/226
[58] Field of Search .............. 331/86, 90, 96–98, 331/178; 315/39.55, 39.61; 333/226, 233

[56] References Cited

U.S. PATENT DOCUMENTS

| | | | |
|---|---|---|---|
| 3,414,761 | 12/1968 | Glenfield | 331/90 X |
| 3,441,794 | 4/1969 | Chun | 331/90 X |
| 3,441,795 | 4/1969 | Hynes et al. | 331/90 X |
| 3,590,313 | 6/1971 | Stoke | 315/39.61 |
| 4,234,855 | 11/1980 | Busacca et al. | 331/90 |
| 4,247,828 | 1/1981 | Busacca et al. | 331/90 |

Primary Examiner—Siegfried H. Grimm
Attorney, Agent, or Firm—Karl F. Ross

[57] ABSTRACT

A resonant cavity of a microwave generator, such as a magnetron oscillator, is provided with a tuning piston which is rectilinearly displaceable between two terminal positions, corresponding to respective limiting frequencies, by means of a rotating crankshaft whose eccentric portion constitutes the inner race of a ball or roller bearing. The outer race of that bearing rolls, directly or through the intermediary of a captive spherical or cylindrical coupling member, on a transverse face of the tuning piston held in contact therewith by spring pressure.

6 Claims, 4 Drawing Figures 4,313,091

CRANKSHAFT TUNING MECHANISMS FOR MICROWAVE OSCILLATORS

FIELD OF THE INVENTION

Our present invention relates to a tuning mechanism for a microwave oscillator, e.g. a coaxial magnetron, having a resonant cavity in which a tuning element such as a piston is linearly displaceable between two terminal positions corresponding to respective limiting frequencies.

BACKGROUND OF THE INVENTION

In commonly owned U.S. application Ser. No. 53,275, filed June 29, 1979 by three of us (Guido Busacca, Vincenzo Meli and Arcangelo Passaglia), now U.S. Pat. No. 4,247,828, there has been described a mechanism for the purpose set forth in which a tuning piston is rigid with a yoke spacedly surrounding a nonrotatable following ring. This ring hugging an eccentric portion of a rotating crankshaft through the intermediary of a ball bearing is suspended between two flexible wires or blades which are anchored to the piston and to an extension thereof on the opposite side of the yoke. This arrangement enables the piston to be linearly guided while allowing the ring to follow the lateral excursions of the eccentric crankshaft portion.

OBJECT OF THE INVENTION

The object of our present invention is to provide a simplified version of the tuning mechanism disclosed in the earlier application which, like the latter, eliminates the friction and attendant wear of articulated joints in prior tuning systems while establishing a linear relationship between the piston stroke and the angle of rotation of the crankshaft.

SUMMARY OF THE INVENTION

In accordance with our present improvement the follower ring is substantially nonrotatingly maintained by spring pressure in rolling contact with a transverse face of the tuning element referred to hereinafter as a piston, thus eliminating the need for the aforementioned flexible wires or blades; the yoke spacedly surrounding that ring is no longer essential but may be retained for improved rectilinear guidance of the tuning piston.

According to a more particular feature of our invention, the follower ring positively engages a captive coupling member on the transverse contact face of the tuning piston in order to be held against rotation about the crankshaft axis. Such a coupling member advantageously is of circular cross-section in a plane transverse to that axis and is lodged in an arcuate cutout of larger radius in the outer periphery of the ring so as not to interfere with the rolling motion thereof on the contact face.

BRIEF DESCRIPTION OF THE DRAWING

The above and other features of our invention will now be described in detail with reference to the accompanying drawing in which.

SPECIFIC DESCRIPTION

Figure 1:
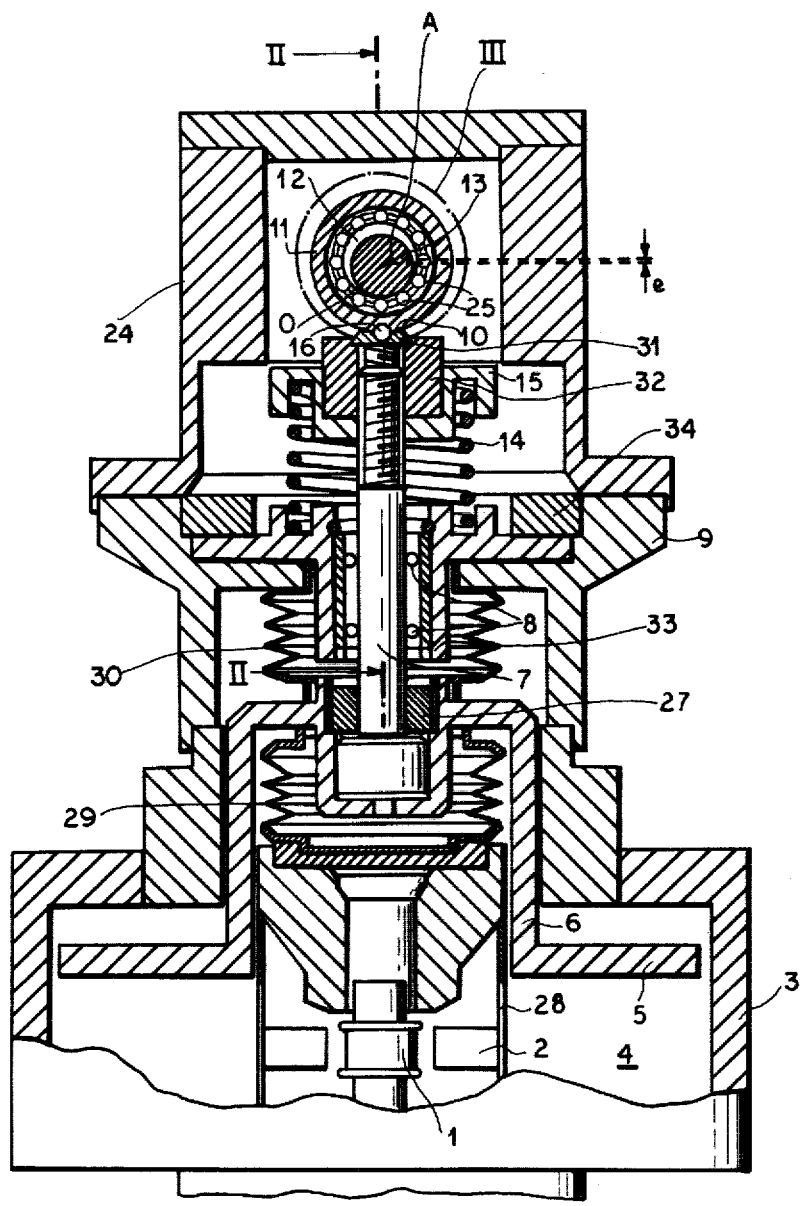
FIG. 1 is an axial sectional view of a magnetron oscillator embodying the present improvement.
Figure 2:
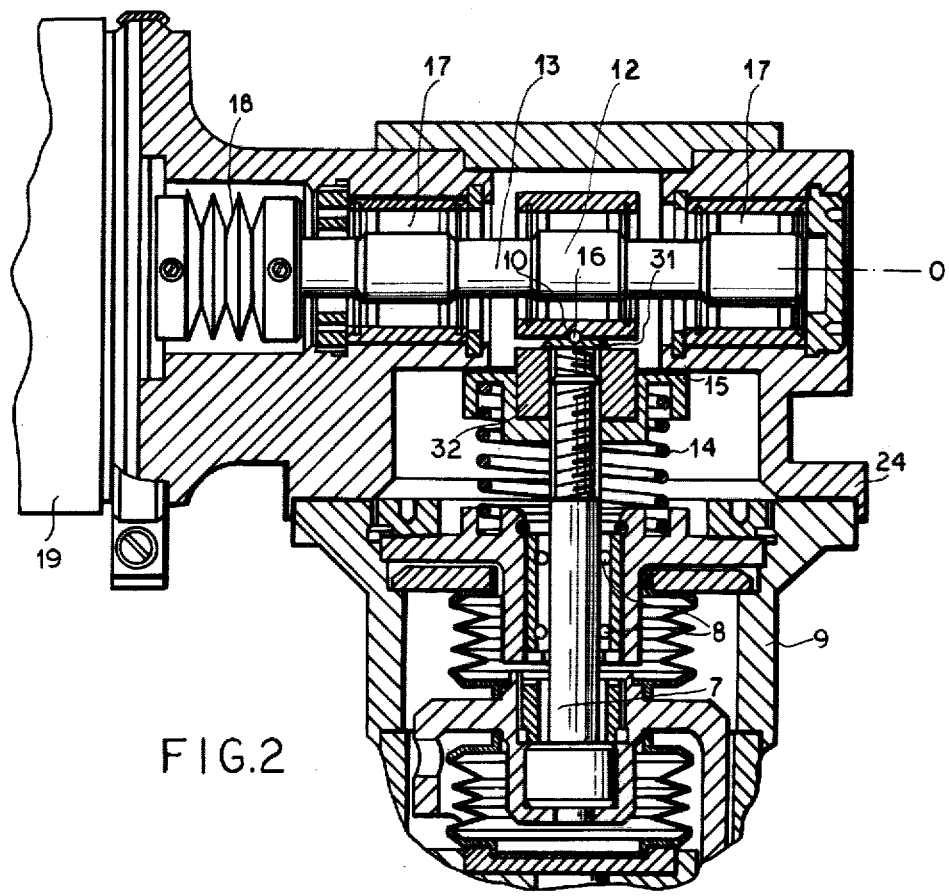
FIG. 2 is a framentary cross-sectional view taken on the line II—II of FIG. 1.

In FIG. 1 we have shown a coaxial magnetron comprising a cathode 1 at the center of an anode block 2 illustrated in greater detail in another commonly owned copending U.S. application, Ser. No. 8,091, filed Jan. 31, 1979 by two of us (Guido Busacca and Michele Sanfilippo) jointly with two others and now U.S. Pat. No. 4,234,855. This electrode structure is concentrically surrounded by a hollow cylinder 3 defining therewith an annular resonant cavity 4 which communicates with the interior of the structure by way of slots 28 in the anode wall. The effective volume of resonant cavity 4 can be varied with the aid of an annular piston 5 of conductive material, spaced from the conductive cavity wall, which is provided with a boss 6 of inverted-cup shape encompassing part of the electrode structure. Bellows 29 and 30 keep the evacuated cavity 4 sealed against the atmosphere.

Figure 3:
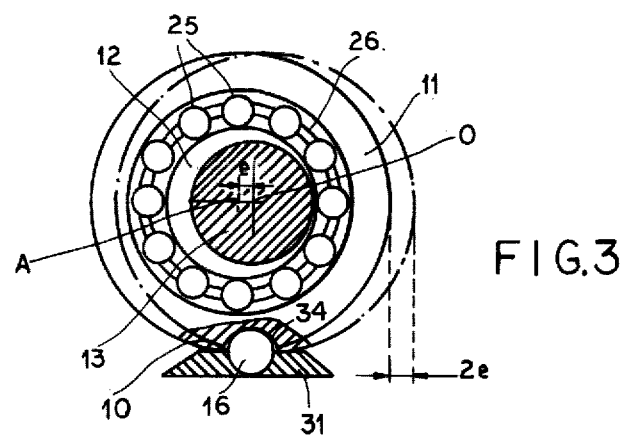
FIG. 3 is an enlarged detail view of the area encompassed by a circle III in FIG. 1.

Cylinder 3 forms part of a housing which also includes a shell 9 surrounding the bellows 30. Shell 9 is topped by a superstructure 24 in which a crankshaft 13 is journaled by means of roller bearings 17 for rotation about an axis O. Crankshaft 13 has an offset portion 12, of eccentricity e and axis A, forming the inner race of an antifriction bearing whose outer race is a follower ring 11; the bearing further includes a set of rotary bodies (balls or rollers) 25 held in position by a cage 26. The outer periphery of ring 11 is in rolling contact with a transverse face 10 of a stem 7 which is fixedly secured by a locking nut 27 to the boss 6 of tuning piston 5; in the arrangement particularly illustrated, this face is the upper surface of a wedge 31 (see also FIG. 3) received in a dovetail-shaped transverse slot of a retaining nut 32 which is screwed onto the threaded upper end of stem 7 in a flanged cup 15 traversed by that stem. A compression spring 14 bears upon the flange of cup 15 and upon a similar flange of a guide sleeve 33, retained in housing shell 9 by a locking nut 34, in which the stem 7 is slidably mounted with the aid of a ball bearing 8.

Shaft 13 is driven, via a flexible coupling 18, by a motor 19 at a speed which may be as high as about 10,000 RPM.

The resiliency of spring 14 is sufficient to overcome the inertial force of the linearly moving piston mass in order to maintain the contact between piston face 10 and ring 11 throughout a full rotation of the crankshaft 13 in which its eccentric portion 12 moves vertically with a stroke $2e$ between its upper and lower dead-center positions and also carries out lateral excursions of $\pm e$ from its position in line with piston stem 7. These lateral excursions, however, are not transmitted to the stem 7 because of the rolling contact between the stem and the ring. Since the point of contact is remote from the cavity 4 in which heat is electrically generated, the small friction between the relatively movable elements 11 and 31 subjects them to very little wear as long as the friction between the bearing races 11,12 and the rotary bodies 25 is low enough to avoid any rotational entrainment of the ring 11 about axis O. For a positive prevention of such entrainment, we prefer to provide these relatively movable elements with a captive coupling member 16 shown in the drawing as a small ball; it will be understood, however, that this member could also be a cylindrical pin of similar diameter parallel to the axes A and O. Ball (or pin) 16 is lodged in a roughly hemispherical (or semicylindrical) cutout 34 of ring 11 whose radius is somewhat larger than that of the coupling member itself so as not to interfere with the rolling motion of the ring on face 10 as that ring oscillates laterally between its two positions respectively illustrated in full lines and in phantom lines in FIG. 3. If desired, face 10 could be coated with a low-friction layer.

Figure 4:
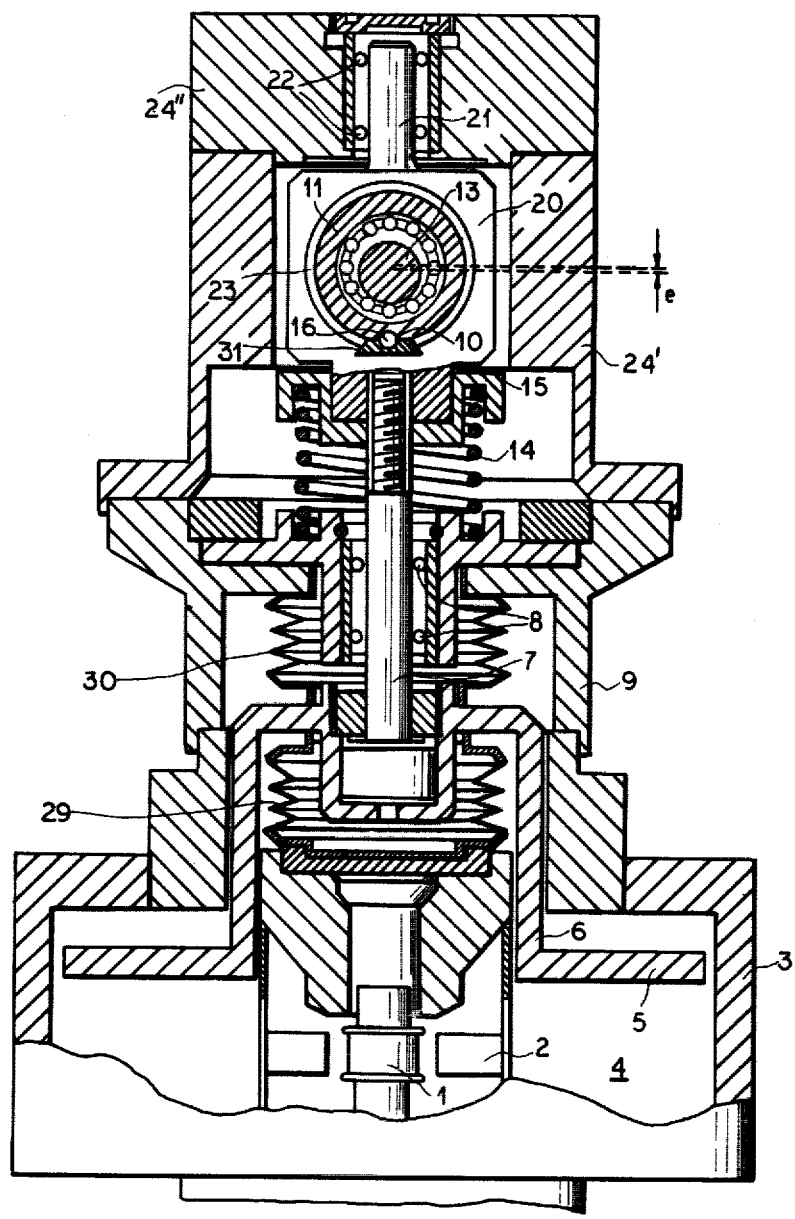
FIG. 4 is a view similar to FIG. 1, illustrating a modification.

In FIG. 4 we have illustrated a modified housing superstructure 24' accommodating a yoke 20 which surrounds the ring 11 with all-around clearance 23 and replaces the nut 31 of the previous embodiment as a retaining element for the spring anchor 15 and as a lodgment for the wedge 31. Yoke 20 has an upward extension 21 in line with stem 7 which is linearly guided by a ball bearing 22 in a cover plate 24" secured to superstructure 24'. Clearance 23, of course, has a width exceeding the eccentricity e so as not to interfere with the lateral excursions of ring 11.

The assembly according to our invention establishes a simple harmonic motion for the tuning piston with a stroke proportional to the cosine of the angle of crankshaft rotation which can be determined by a conventional position sensor designed to provide a reading of the instantaneous operating frequency of the magnetron oscillator.

We claim:

1. In a generator of microwaves of variable frequency provided with a resonant cavity and a tuning element in said cavity, said tuning element being linearly displaceable between two terminal positions corresponding to respective limiting frequencies, the combination therewith of:

a rotatable crankshaft provided with an eccentric portion offset by a distance e from its axis of rotation;

a follower ring surrounding said eccentric portion in operative engagement therewith, via interposed antifriction means, for substantially nonrotating displacement with a stroke 2e in the direction of motion of said tuning element and with lateral excursions of like magnitude in a direction transverse thereto; and spring means engaging said tuning element and maintaining a transverse face thereof in rolling contact with said ring for linear reciprocation by said stroke 2e.

2. The combination defined in claim 1 wherein said antifriction means comprises a set of rotary bodies.

3. The combination defined in claim 1, further comprising a captive coupling member on said transverse face positively engaged by said ring for preventing rotation of the latter about said axis.

4. The combination defined in claim 3 wherein said coupling member is of circular cross-section in a plane transverse to said axis and is lodged in an arcuate peripheral cutout of said ring having a radius larger than that of said cross-section.

5. The combination defined in claim 1, 2, 3 or 4 wherein said tuning element is provided with antifriction guide means ensuring its linear displacement.

6. The combination defined in claim 5, further comprising a yoke rigid with said tuning element spacedly surrounding said ring, said face being formed on an inner surface of said yoke, said guide means including a first bearing sleeve surrounding said tuning element and a second bearing sleeve surrounding an extension thereof beyond said yoke.

* * * * *